United States Patent [19]

Sangyoji et al.

[11] Patent Number: 4,814,808
[45] Date of Patent: Mar. 21, 1989

[54] DEVELOPING APPARATUS FOR PHOTO/PRESSURE SENSITIVE SHEET

[75] Inventors: Kazuo Sangyoji; Takemi Yamamoto; Osamu Takagi, all of Nagoya; Hitoshi Yoshida, Konan; Naoto Iwao; Yoshiyuki Ban, both of Nagoya, all of Japan

[73] Assignee: Brother Kogyo Kabushiki Kaisha, Nagoya, Japan

[21] Appl. No.: 106,135

[22] Filed: Oct. 7, 1987

[30] Foreign Application Priority Data

Oct. 9, 1986 [JP] Japan .................. 61-155461[U]
Feb. 7, 1987 [JP] Japan .................. 62-26707
Sep. 4, 1987 [JP] Japan .................. 62-220397

[51] Int. Cl.$^4$ .................. G03C 1/72; G03D 9/02
[52] U.S. Cl. .................. 354/304; 354/297; 355/27; 430/3; 430/138; 100/264; 100/917
[58] Field of Search .................. 354/297, 304; 355/27, 355/28; 430/3, 138; 100/214, 264, 917

[56] References Cited

U.S. PATENT DOCUMENTS

| 4,448,516 | 5/1984 | Arney et al. | 355/27 |
| 4,554,235 | 11/1985 | Adair et al. | 430/138 |
| 4,578,339 | 3/1986 | Adkins | 430/138 |
| 4,687,725 | 8/1987 | Wright et al. | 430/138 |
| 4,727,392 | 2/1988 | Stone et al. | 355/27 |

Primary Examiner—A. A. Mathews
Attorney, Agent, or Firm—Kane, Dalsimer, Sullivan, Kurucz, Levy, Eisele and Richard

[57] ABSTRACT

Disclosed is a photo-pressure sensitive recording sheet developing apparatus in which vibratory pressure generated by an ultrasonic wave generating means is applied to a photo/pressure sensitive recording sheet using microcapsules carrying a latent image formed through exposure to thereby develop the photo/pressure sensitive recording sheet by the vibratory pressure. Preferably, the ultrasonic wave generating means is formed as a single resonance system and has parallel surfaces opposite to each other, each of the opposite surfaces having a vibration mode so that the opposite surfaces are displaced in the directions opposite to each other and substantially along a vertical axis of the opposite surfaces.

6 Claims, 4 Drawing Sheets

DEVELOPING APPARATUS FOR PHOTO/PRESSURE SENSITIVE SHEET

BACKGROUND OF THE INVENTION

1. Field of the Invention

The present invention relates to a pressure developing apparatus, for example, in a copying machine, an optical printer, or the like, for developing a latent image obtained by exposing a photo/pressure sensitive sheet on which photosensitive microcapsules are applied, and particularly relates to an ultrasonic developing apparatus which employs an ultrasonic vibrator as pressure generating means.

2. Description of Prior Art

As disclosed, for example, in Japanese Patent Unexamined Publication Nos. 58-23025/1983, 58-88739/1983, ETC., known is a photo/pressure sensitive sheet in which microcapsules each containing a dye-precursor, photo-sensitive resin, etc. are dispersively applied into a paper base together with a developer which will cause a development reaction in cooperation with the die-precursor. There has been developed a photo/pressure sensitive sheet of the transfer type in which a photo-sensitive sheet onto which only microcapsules are dispersively applied and a transfer sheet onto which only a developer is applied are used in pair. The photo-pressure sensitive sheet has been promoted to be utilized for a copying machine, an optical printer, etc. For Example, when the photo/pressure sensitive sheet of the transfer type is used for the copying machine, light is radiated on a surface of an original so as to scan the surface, so that the surface of the photo-sensitive sheet is exposed to the light which has scanned the surface of the original. Succeedingly, the photo-sensitive sheet and the transfer sheet are put on each other and are passed between pressing rollers so as to break the unhardened ones of the microcapsules by pressure so that a development reaction is caused between the dye-precursor body and the developer to thereby obtain development on the transfer sheet. Accordingly, according to the photo-pressure sensitive sheet, there are such advantages that use of toner is not necessary, copied materials of high resolution can be obtained, etc.

However, when the unhardened ones of the microcapsules on the photo/pressure sensitive sheet are broken by the pressing rollers, pressure of about 500 through 600 Kg/cm$^2$ is required between the pressing rollers because of load resisting force of the microcapsules. This value of pressure is approximately three times of that for the pressing rollers used in a conventional copying machine for ordinary paper. Therefore, there have been many disadvantages that wrinkles are produced on the sheet, the sheet is broken when foreign matters are rolled between the rollers, the surface of the sheet is made glossy owing to the high roll-pressure so as to be hardly seen.

SUMMARY OF THE INVENTION

It is therefore an object of the present invention to eliminate the disadvantages in the prior art.

It is another object of the present invention to provide a developing apparaus for a photo/pressure sensitive sheet which is simple in arrangement and easy to maintenance.

It is a further object of the present invention to provide a developing apparatus in which development is carried out by the application of vibratory pressure generated by ultrasonic wave generating means onto a surface of a photo/pressure sensitive sheet.

In order to achieve the above-mentioned objects, according to the present invention, the photo-pressure sensitive recording sheet developing apparatus is arranged in a manner so that vibratory pressure generated by an ultrasonic wave generating means is applied to a photo/pressure sensitive recording sheet using microcapsules carrying a latent image formed through exposure to thereby develop the photo/pressure sensitive recording sheet by the vibratory pressure.

In the thus arranged developing apparatus according to the present invention, if ultrasonic vibratory pressure is applied onto a photo/pressure sensitive sheet which has been subject to predetermined exposure processing, unhardened ones of microcapsules are minutely broken by the ultrasonic vibratory pressure so as to carry out predetermined developing processing. The copied material obtained through the developing processing is not only superior in resolution unlike the development with toner but capable of preventing wrinkles or luster from being produced, or of preventing the sheet from being broken, so that the copied material has a preferable finished surface.

Preferably, the ultrasonic wave generating means is formed as a single resonance system and has parallel surface opposite to each other, each of the opposite surfaces having a vibration mode so that the opposite surfaces are displaced in the directions opposite to each other and substantially along a vertical axis of the opposite surfaces.

In the thus arranged ultrasonic developing apparatus, an exposed recording sheet is passed between the opposite parallel surfaces of the ultrasonic wave generating means which is formed as a single resonance system having the parallel opposite surfaces. The parallel opposite surfaces may be displaced in the opposite directions substantially along the vertical axis of the opposite surfaces, so that pressing force is produced by the ultrasonic wave generating means to thereby develop the exposed recording sheet by the pressing force.

DESCRIPTION OF PREFERRED EMBODIMENTS

Figure 1:
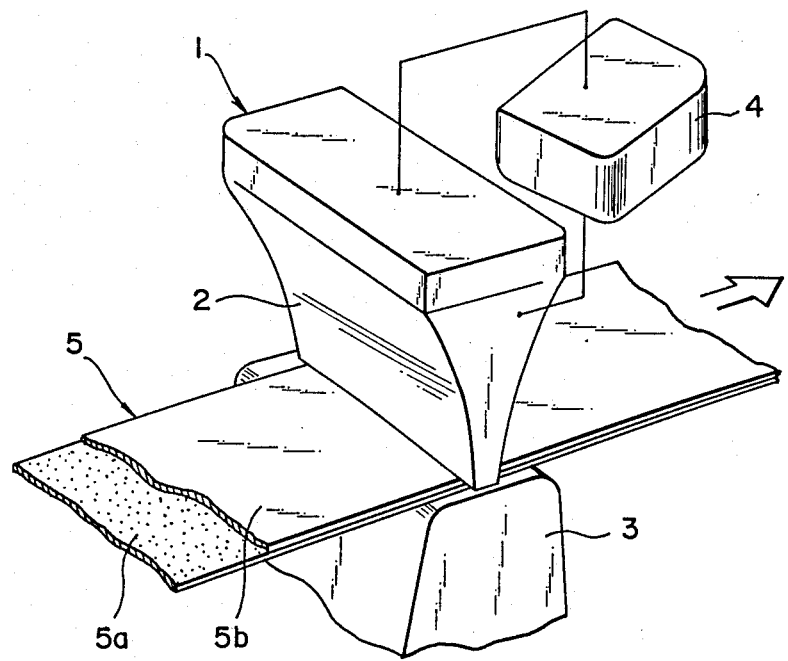
FIG. 1 is a perspective view showing a main portion of an embodiment of the photo/pressure sheet developing apparatus according to the present invention.

Referring to the drawings, embodiments of the present invention will be described hereunder.

FIG. 1 is a perspective view showing an embodiment of the present invention. In the drawing, an ultrasonic vibrator 1 is provided with a horn 2 at its forward end and arranged so that the horn 2 is in opposition to the surface of a platen 3 with a small gap therebetween. An ultrasonic oscillator 4 is connected to the ultrasonic vibrator 1 so as to supply ultrasonic vibration to the ultrasonic vibrator 1. In that case, a photo/pressure sensitive sheet 5 is conveyed through the gap between the horn 2 and the platen 3 in the direction indicated by an arrow. The length of each of the horn 2 and the platen 3 in the widthwise direction of the photo/pressure sensitive sheet 5 to be conveyed is made to be a little longer than the width of the photo/pressure sheet 5, so that the vibratory pressure of the ultrasonic vibrator 1 can be applied onto the photo/pressure sensitive sheet 5 over the entire width thereof. The embodiment shows the case of development of a photo/pressure sensitive sheet of the transfer type, in which a transfer sheet 5b is put on a photo-sensitive sheet 5a which has been subject to exposure processing and then the stack of those sheets are conveyed through the gap between the horn 2 and the platen 3.

At that time, the vibratory pressure put out of the foreward end surface of the horn 2 of the ultrasonic vibrator 1 is applied to the surface of the photo/pressure sensitive sheet 5 which is being conveyed through the gap between the horn 2 and the platen 3, so that the unhardened ones of microcapsules on the surface of the photo-sensitive sheet 5a are broken so as to cause a development reaction with a developer on the surface of the transfer sheet 5b, thereby carrying out developing processing on the surface of the transfer sheet 5b. In that case, the intensity of the output of the ultrasonic oscillator 4, the sectional area of the forward end surface of the horn 2, the dimension of the gap between the horn 2 and the platen 3, and so on may be primary factors of variations in the vibratory pressure applied onto the photo/pressure sensitive sheet 5, and therefor it is needless to say that those setting conditions are previously suitably selected. Particularly in the embodiment, although the dimension of the gap between the horn 2 and the platen 3 in the direction vertically passing through the running stack of the photo-sensitive sheet 5a and the transfer sheet 5b of the photo/pressure sensitive sheet 5 is made to be substantially equal to the thickness of the stack of sheets 5a and 5b, the frictional resistance of the photo/pressure sensitive sheet 5 being conveyed through the gap between the horn 2 and the platen 3 is very small because of the ultrasonic vibration. The ultrasonic vibration breaks the unhardened ones of the microcapsules while repeating application and release of the pressing force onto the surface of the photo/pressure sensitive sheet at a high frequency. Accordingly, wrinkles or luster can be prevented from being generated on the sheet surface, and the photo-sensitive sheet 5a or the transfer sheet 5b is never broken.

Although the block-like stationary platen is used in the embodiment, the present invention is not limited such a platen as illustrated, but the platen may be suitably modified in design. For example, being not shown, instead of the block-like platen, a roller-like platen which is rotatable in the direction in which the photo/pressure sensitive sheet is conveyed so that the photo-pressure sensitive sheet 5 may be more smoothly conveyed. Alternatively, instead of those platens, two ultrasonic wave generating means are provided separately from each other so as to utilize the vibratory force between the two ultrasonic wave generating means.

According to the developing apparatus of the embodiment, not only a copied material superior in resolution peculiar to the photo/pressure sheet can be obtained, but all the problems that the copied material becomes hard to be seen owing to wrinkles generated on the surface thereof, that excessive luster losing naturalness is caused on the surface thereof, and so on, can be solved. Further, there are such advantages that the apparatus is simple in arrangement, easy to maintenance, etc., in comparison with the conventional apparatus of the roller pressing type.

Figure 2:
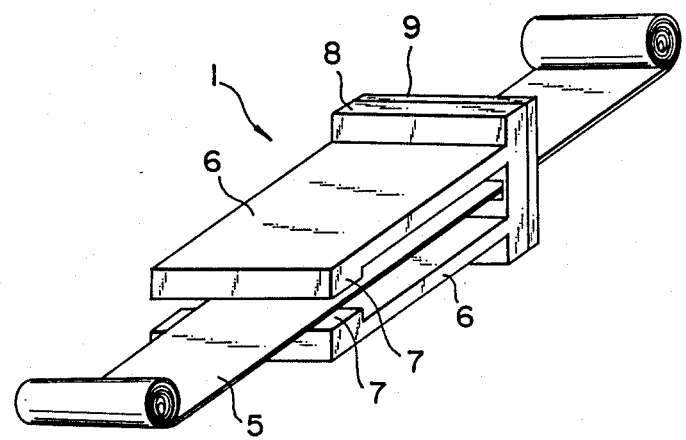
FIG. 2 is a perspective view showing a main portion of another embodiment of the photo/pressure sensitive developing apparatus according to the present invention.
Figure 3:
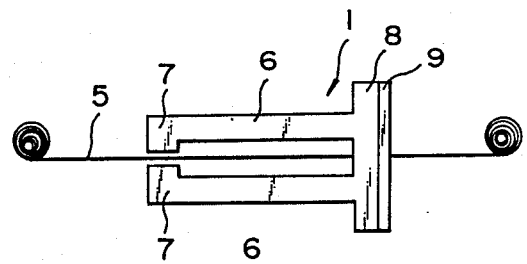
FIG. 3 is a side view showing the main portion shown in FIG. 2.

FIGS. 2 and 3 are a perspective view and a side view showing a second embodiment of the ultrasonic developing apparatus according to the present invention respectively. In the drawings, the parts the same as or equivalent to those in FIG. 1 are correspondingly referenced. In the drawings, an ultrasonic vibrator 1 used as pressure generating means constitutes a single resonance system. The ultrasonic vibrator 1 is constituted by upper and lower cantilever-like plate portions 6 and 6 respectively having parallel surfaces 7 and 7 opposite to each other and a flexible vibratory portion 8 from which the plate portions 6 and 6 are extended parallelly to each other. The parallel opposite surfaces 7 and 7 are arranged so that recording sheet 5 which has been subject to exposure processing is caused to pass through a gap between the parallel opposite surfaces 7 and 7.

A piezo-electric element 9 is attached on the flexible vibratory portion 8 of the ultrasonic vibrator 1. An electric signal having a suitable frequency is applied to the piezoelectric element 9 from an electric signal generating means (not shown).

Figure 4A:
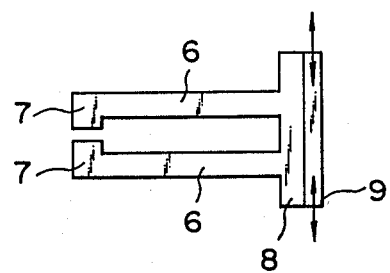
FIGS. 4A through 4C are schematic views showing vibratory modes of an ultrasonic vibrator in the second embodiment.
Figure 4B:
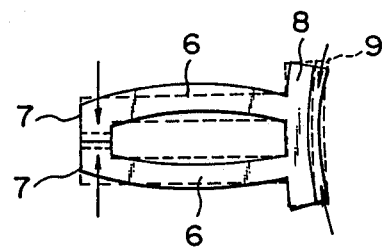
Figure 4C:
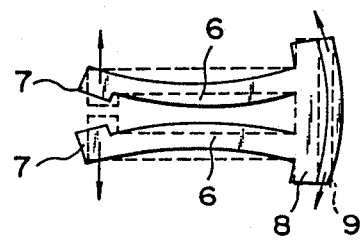

FIGS. 4A through 4C are schematic views of vibratory modes of the ultrasonic vibrator 1. If vibration in the directions shown by arrows in FIG. 4A is excited, the ultrasonic vibrator 1 repeatedly vibrates as shown in FIGS. 4B and 4C. In such an arrangement, when the recording paper 5 on which a latent image has been previously formed through exposure is passed through the gap between the opposite parallel surfaces 7 and 7, pressure is sufficiently applied on the recording paper 5 in the state as shown in FIG. 4B, so that sure development can be carried out.

As being apparent from the contents of the above disclosure, according to the present invention, the ultrasonic vibrator is used as the pressure generating means, so that the apparatus can be miniaturized, and further the ultrasonic vibrator is arranged to be a single resonance system, so that vibratory phases on the opposite surfaces 7 and 7 are completely synchronized with each other and there is no problem of synchronization if vibration which becomes necessary in the case where a pair of ultrasonic vibrators are provided as described above as a modification of the first embodiment.

The present invention is not limited to the embodiments described above but various changes or modifications can be made in a range where the changes of modifications are not departed from the scope of the present invention. For example, although the ultrasonic vibrator 1 is provided with the cantilever-like plate portions in the embodiment, the cantilever-like plate portions can be substituted by two members in the form of levers each of which is supported at its opposite ends. Although the pizeo-electric element is directly attached to the bent vibratory portion of the ultrasonic vibrator 1 to excite the vibration, the exciting method is not limited to this but any exciting method can be used so long as the ultrasonic vibrator 1 can be made to vibrate in the vibratory modes shown in FIGS. 4B and 4C. Further, although the pizeo-electric element is used for the excitation, an electrostrictor or a magnetostrictor can be substituted therefor.

Figure 5:
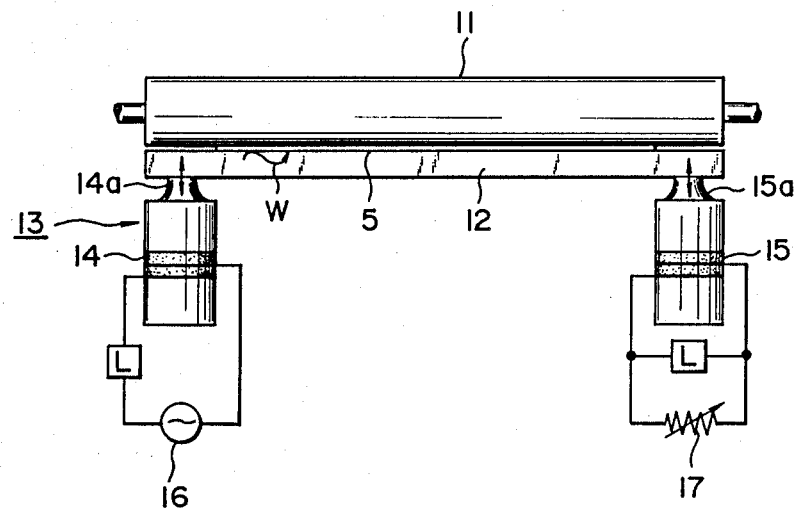
FIG. 5 is a schematic diagram showing a further embodiment of the present invention.
Figure 6:
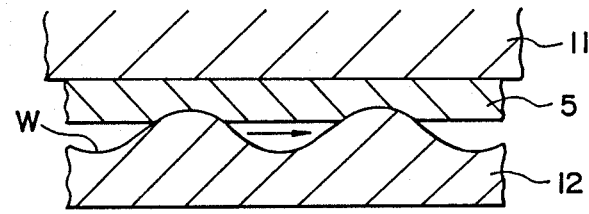
FIG. 6 is an enlarged view of a part of FIG. 5 for explaining the operation of the embodiment.

FIG. 5 shows a third embodiment of the present invention, in which, as shown in FIG. 5, a pressure generating means is constituted by a platen 11 and a transmission rod 12 which are used as a pair of sandwiching members for sandwiching a photo/pressure sensitive sheet 5, and a traveling-wave application device 13 which is used as a traveling-wave application means for applying an ultrasonic traveling wave to the transmission rod 12.

As shown in FIG. 5, the traveling-wave application device 13 is provided with a pair of Langevin vibrators 14 and 15 on a driving side and a wave-reception side respectively, and respective horns 14a and 15a of the Langevin vibrators 14 and 15 are connected to the transmission rod 12 at the opposite lower end portions thereof respectively.

An oscillator 16 is connected to the Langevin vibrator 14 on the driving side so that the Langevin vibrator 14 on the driving side is vertically vibrated at a given frequency by the oscillator 16. The transmission rod 12 is excited on the basis of the above-mentioned vertical vibration so that a traveling wave W is transmitted to the wave-reception side along the transmission rod 12 and received by the Langevin vibrator 15 as shown inFIGS. 5 and 6. A load resistance 17 is connected to the Langevin vibrator 15 on the wave-reception side, the value of the load resistance 17 being adjusted to make impedance matching so as to prevent generation of a standing wave.

Thus, according to the third embodiment of the pressing developing apparatus, the traveling wave W is continuously moved from the driving side to the wave-reception side along the transmission rod 12 by repetition of the above operations of the vibration application and the wave reception. The amplitude and the frequency of the traveling wave W, for example on the surface of the transmission rod 12 are about 100 microns and about 10 KHz respectively, so that the photo/pressure sensitive sheet 5 is pressed between the transmission rod 12 and the platen 11 by the traveling wave generated on the surface of the transmission rod 12. By the pressure, microcapsules not-hardened by light are broken on the photo/pressure sensitive sheet 5 so that a dye-precursor in each of the broken microcapsules flows out to react with a developer provided on the photo/pressure sensitive sheet 5 to thereby develop the latent image formed by the microcapsules. Thus, a picture is formed on the photo/pressure sensitive sheet 5.

As described above, in the developing apparatus of the third embodiment, the traveling wave is applied to the transmission rod 12 by the traveling-wave application device 13 under the condition that the exposed photo/pressure sensitive sheet 5 is sandwiched between the platen 11 and the trasmission rod 12, so that the photo/pressure sensitive sheet 5 is pressed by the traveling wave. Accordingly, not only the whole of the apparatus can be reduced in size as well as in weight in comparison with the conventional apparatus using large-sized and heavy pressing rollers made of steel or the like, but the not-hardened microcapsules on the photo/pressure sensitive sheet 5 can be surely broken in spite of the fact that the power consumption can be decreased.

What is claimed is:

1. A photo and pressure sensitive recording sheet developing apparatus comprising:
   ultrasonic wave generating means;
   a horn connected to said ultrasonic wave generating means; and,
   a platen disposed opposite to said horn with a gap therebetween whereby a photo and pressure sensitive recording sheet may be developed at said gap by the vibratory pressure generated thereat.

2. A photo and pressure sensitive recording sheet developing apparatus comprising:
   a first ultrasonic wave generating means;
   a second ultrasonic wave generating means disposed in opposition to said first ultrasonic wave generating means with a gap therebetween whereby a photo and pressure sensitive recording sheet may be developed at said gap by the vibratory pressure generated thereat.

3. A photo and pressure sensitive recording sheet developing apparatus comprising:
   a single resonance ultrasonic wave generating means having first and second parallel surfaces in opposition to each other, each of said surfaces having a vibration mode whereby said opposite surfaces are disposed in directions opposite to each other and substantially along a vertical axis of said surfaces.

4. A photo and pressure sensitive developing apparatus according to claim 3, in which said ultrasonic wave generating means has a pair of plate members each supported at its one end or opposite ends and each having a vibration mode of bending or flexible vibration.

5. A photo and pressure sensitive recording sheet developing apparatus comprising:
   ultrasonic wave generating means including a traveling wave application means;
   a pair of sandwiching members connected to said traveling wave application means whereby a photo and pressure sensitive recording sheet may be developed by being passed between said pair of sandwiching members.

6. A photo and pressure sensitive recording sheet developing apparatus comprising:
   an ultrasonic wave generating means comprising an ultrasonic vibrator and a single resonance system whereby a photo and pressure sensitive recording sheet may be developed by vibratory pressure applied to said sheet through said single resonance system.

* * * * *